(12) United States Patent
Trimmer

(10) Patent No.: US 8,762,764 B2
(45) Date of Patent: Jun. 24, 2014

(54) METHOD TO DETECT CLOCK TAMPERING

(75) Inventor: Mark Trimmer, Buckinghamshire (GB)

(73) Assignee: STMicroelectronics (Research & Development) Limited, Buckinghamshire (GB)

( * ) Notice: Subject to any disclaimer, the term of this patent is extended or adjusted under 35 U.S.C. 154(b) by 698 days.

(21) Appl. No.: 12/985,011

(22) Filed: Jan. 5, 2011

(65) Prior Publication Data

US 2011/0163736 A1 Jul. 7, 2011

(30) Foreign Application Priority Data

Jan. 5, 2010 (GB) .................................. 1000094.1

(51) Int. Cl.
*G06F 1/00* (2006.01)

(52) U.S. Cl.
USPC ............................ 713/500; 702/125; 714/814

(58) Field of Classification Search
USPC ............................. 713/500; 714/814; 702/125
See application file for complete search history.

(56) References Cited

U.S. PATENT DOCUMENTS

| | | | |
|---|---|---|---|
| 4,408,169 A * | 10/1983 | Fraser | 331/65 |
| 5,483,201 A | 1/1996 | Bortolini | |
| 6,535,988 B1 | 3/2003 | Poisner | |
| 6,553,496 B1 | 4/2003 | Buer | |
| 7,385,491 B2 | 6/2008 | Doi | |
| 7,472,305 B1 | 12/2008 | Hershman et al. | |
| 8,190,923 B2 * | 5/2012 | Daverman et al. | 713/194 |
| 2008/0310568 A1 | 12/2008 | Sander | |
| 2009/0292902 A1 * | 11/2009 | Henry et al. | 712/40 |

FOREIGN PATENT DOCUMENTS

| | | |
|---|---|---|
| JP | 58088670 A | 5/1983 |
| JP | 59062270 A | 4/1984 |
| WO | WO 2004/006163 A1 | 1/2004 |

OTHER PUBLICATIONS

Search Report dated Apr. 15, 2010 in connection with United Kingdom Patent Application No. GB1000094.1.
European Search Report dated Apr. 8, 2011 in connection with European Patent Application No. 11 15 0123.

* cited by examiner

*Primary Examiner* — Mark Connolly

(57) ABSTRACT

This invention relates to a method of receiving a first potentially unreliable clock signal having a first frequency; receiving a second reliable clock signal having a second frequency; wherein the first frequency and the second frequency have an expected relationship; determining whether the first potentially unreliable clock signal has changed with respect to the second reliable clock signal by: determining an actual relationship between the first potentially unreliable frequency and the second reliable frequency; and generating an alarm signal if the actual relationship is different to the expected relationship.

20 Claims, 3 Drawing Sheets

METHOD TO DETECT CLOCK TAMPERING

CROSS-REFERENCE TO RELATED APPLICATION(S) AND CLAIM OF PRIORITY

The present application is related to United Kingdom Patent Application No. 1000094.1, filed Jan. 5, 2010, entitled "A METHOD TO DETECT CLOCK TAMPERING". United Kingdom Patent Application No. 1000094.1 is assigned to the assignee of the present application and is hereby incorporated by reference into the present disclosure as if fully set forth herein. The present application hereby claims priority under 35 U.S.C. §119(a) to United Kingdom Patent Application No. 1000094.1.

TECHNICAL FIELD OF THE INVENTION

The present invention relates to a functional block on a chip and a corresponding method. In particular, but not exclusively, some embodiments of the present invention relate to system on chip designs and clock signals produced on and off-chip in system on chip designs.

BACKGROUND OF THE INVENTION

System on chip designs are becoming common where a single chip houses a plurality of logically separate functional blocks. Examples of functional blocks include a clock control block, security block, Analogue to Digital converter and other functional blocks applicable to the system.

Often the clock control block will include functionality for generating a variety of clock signals of different frequencies that may be used by the other functional blocks on chip. These frequencies may be generated with a circuit such as a software programmable phase locked loop (PLL) clock divider.

Functional blocks that receive clock signals from the PLL clock divider have no direct control over the frequency of those clock signals and the functional block accepts that the frequency provided to it is correct and has not been tampered with.

Situations may arise where the frequency of a clock signal received by a functional block cannot be trusted. For example, if an extremely low frequency clock signal is provided the operation of a functional block may be impaired. For example, a security block designed to be clocked by a specific clock frequency should maintain its correct frequency to keep the integrity of its function.

The change in clock frequency may come about purposively, for example a PLL clock divider may be erroneously programmed by software to output a frequency much lower than the ideal operating clock frequency of the functional block. Alternatively the clock control functional block may malfunction. In either case the operation of the security block may be impaired.

SUMMARY OF THE INVENTION

According to a first aspect of the present invention there is provided a method that includes receiving a first potentially unreliable clock signal having a first frequency and receiving a second reliable clock signal having a second frequency. The first frequency and the second frequency have an expected relationship. This method also includes determining whether the first potentially unreliable clock signal has changed with respect to the second reliable clock signal by determining an actual relationship between the first potentially unreliable frequency and the second reliable frequency and generating an alarm signal if the actual relationship is different to the expected relationship.

According to a second aspect there is provided a functional block for an integrated circuit configured to receive a first potentially unreliable clock signal having a first frequency and a second reliable clock signal having a second frequency. The first frequency and the second frequency have an expected relationship. The circuitry is further configured to determine whether the first potentially unreliable clock signal has changed with respect to the second reliable clock signal by determining an actual relationship between the first frequency and the second frequency. The circuitry also is configured to generate an alarm signal if the actual relationship is different to the expected relationship.

According to a third aspect, there is provided a security block for an integrated circuit with a clock checking block configured to receive a first potentially unreliable clock signal having a first frequency and receive a second reliable clock signal having a second frequency. The first frequency and the second frequency have an expected relationship and the clock checking block is further configured to determine whether the first potentially unreliable clock signal has changed with respect to the second reliable clock signal by determining an actual relationship between the first frequency and the second frequency and generating an alarm signal if the actual relationship is different to the expected relationship.

Other technical features may be readily apparent to one skilled in the art from the following figures, descriptions and claims.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure.

Figure 1:
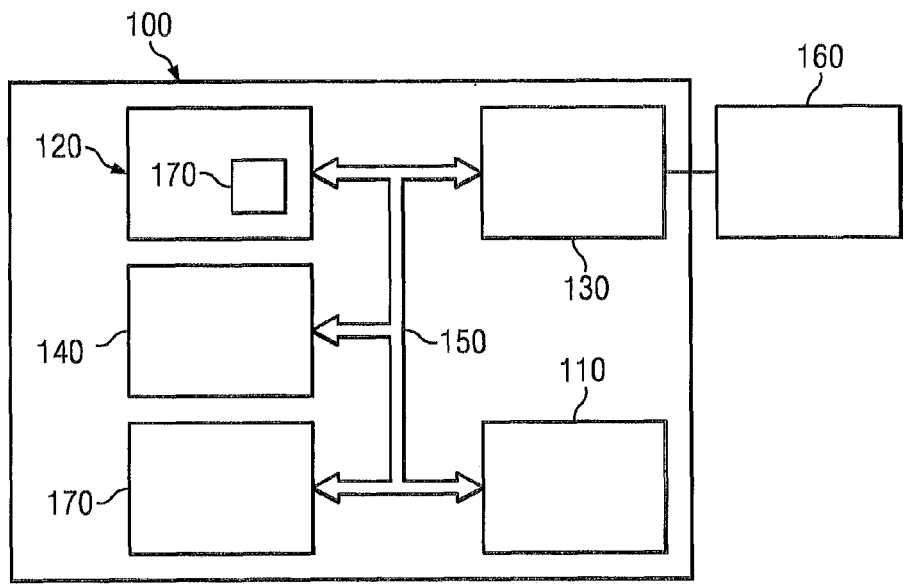
FIG. 1 shows an example of a system in which an embodiment of the present invention is implemented.

FIG. 1 shows an example of system in which some embodiments of the present invention are applicable. FIG. 1 shows several functional blocks that may be implemented on a chip. A Security block 120, Analogue to Digital (A/D) converter 130, Timing generation block 110, CPU 140 and additional functional block 170 are shown implemented on chip 100. Chip 100 also includes a bus 150 that is connected between the security block 120, A/D converter 130, Timing generation block 110, CPU 140 and additional block 170. The bus 150 facilitates communication between the functional blocks.

The Timing generation block 110 generates a clock signal for each functional block of chip 100. The clock signal corresponds to an operating frequency of that functional block. In other words the clock signal generated for the functional block will clock that block at an operational frequency required by that block. The operational frequency of a block is determined by the operations that the block is to carry out. Some functional blocks may be configured to operate at a higher frequency than other blocks. Alternatively, the functional blocks may be configured to operate at the same clocking frequency. In this case, the timing generation block 110 generates one clock signal and outputs this signal to the functional blocks. The clock signal(s) are provided to the functional blocks over bus 150.

FIG. 1 also shows a clock source 160 external to chip 100. External clock source 160 may be a crystal oscillator and provides an external clock signal at a stable frequency to chip 100. The timing generation block uses the external clock source signal to generate the one or more clock signals provided to the functional blocks. The timing generation block 110 may comprise a software programmable PLL clock divider that converts the external clock signal to other clock signals with different frequencies. The timing generation block 110 may include other circuitry capable of providing the same extend of clock signals of various frequencies.

The clock source 160 is connected to chip 100 and is available to at least some of the functional blocks in addition to the timing generation block implemented on chip 100. The on chip connection between the functional blocks and the reliable clock source signal 160 is not shown in FIG. 1. The reliable clock source signal may be used by the timing generation block 110 to generate the on chip clock signals.

The external clock 160 is considered as being able to provide a reliable frequency. A frequency is considered reliable if the frequency cannot be changed by tampering and/or any other factors and the frequency provided is the frequency expected. The external clock 160 represents a clock that is not very susceptible to tampering and provides a reliable frequency. For example, crystal oscillators or the like may not be susceptible to tampering because of their physical structure.

The timing signals from the timing generation block 110 are considered to be potentially unreliable. The timing generation block 110 outputs clock signals on the basis of software programming. This programming of the timing generation block increases the susceptibility of the timing generation block 110 to tampering because the timing generation block 110 may be mis-programmed either deliberately or by a programming error. The clock signals generated by the timing generation block 110 are not considered to be as reliable as the external clock signal.

One of the abovementioned clock signals generated by the timing generation block 110 is provided to the security block 120 over bus 150. The security block 120 is used to implement certain security functions on the chip 100. By way of example only, the security block may monitor the bus for illegal transactions or suspicious behaviour. It may store, process and apply chip secrets, e.g. decryption keys). The security block may provide alarm signals as soon as problems are detected.

The security block 120 is functional at a specific clock frequency provided by a clock signal from the timing generation block 110. This specific clock frequency may be a frequency range. As discussed above the clock signal provided to the security block 120 by the clock generation block 110 may be different to the specific clock frequency expected by the security block 120. If the clock signal received by a security block has a different frequency to the clock frequency expected by a security block, the security block may not function properly.

The security block 120 includes clock checking block 170 which can determine whether the clock signal received by the security block 120 has a different frequency to the clock frequency expected by the security block 120. Security block 120 has access to the external clock signal generated by external clock source 160. The clock checking block 170 uses the external clock signal generated by the external clock source 160 as a reliable clock signal to determine whether the clock signal generated by the timing generation block has been changed.

If the clock checking block 170 determines that the clock signal generated by the timing generation block 110 has been changed it will generate an alarm signal 273. The alarm signal may be output internally to the security block 120 or the alarm signal may be output on the bus 150 to alert all of the functional blocks that the clock signal generated by the timing generation block 110 is not the expected frequency.

The alarm signal 273 may be output to the CPU block 140 which may stop the operation of the chip 100 in response thereto. The security block 120 may be alerted by the alarm signal 273 and take the relevant actions. The alarm may cause for example a chip reset and/or may disable a particular functionality.

Although embodiments of the present disclosure are described in relation to the functional blocks and architecture shown in FIG. 1, it will be understood that the application of the present invention is not restricted to these functional blocks and architecture and any applicable functional blocks may be implemented. For example the chip 100 may include different functional blocks to those shown in FIG. 1. The chip 100 may include more or less functional blocks. Furthermore, the bus topography may be different and the bus may be uni-directional or bi-directional between respective functional blocks.

Although both the external clock source 160 is described as being connected to the functional blocks in addition to the timing generation block 110, it will be understood that the external clock source used by timing generation block 110 to generate clock signals may be different to the external clock source 160.

Although the clock checking block 170 is shown as implemented within the Security block 120, the clock checking block 170 may be implemented on or with any other functional block or as a separate functional block on the chip 100. The clock checking block 170 may alternatively be implemented externally to chip 100 and may be provided on a clock checking chip which is connected to one or more chips such as chip 100. The clock checking chip may contain more than one clock checking block such as clock checking block 170. For any given pair of clocks, one reliable, one not, a clock checking circuit can be provided. Thus one circuit can be used even when the same unreliable clock is used by more than one functional block. The alarm output can go to one or a plurality of destinations.

The clock checking block 170 will now be described in greater detail with reference to FIG. 2 which depicts a first embodiment of a detailed architecture of the clock checking block 170. Although the architecture in FIG. 2 is in the context of the clock checking block 170 of FIG. 1, it will be understood that a clock checking block with the architecture of FIG. 2 is not restricted to system shown in FIG. 1 and may be applied to any relevant system.

Figure 2:
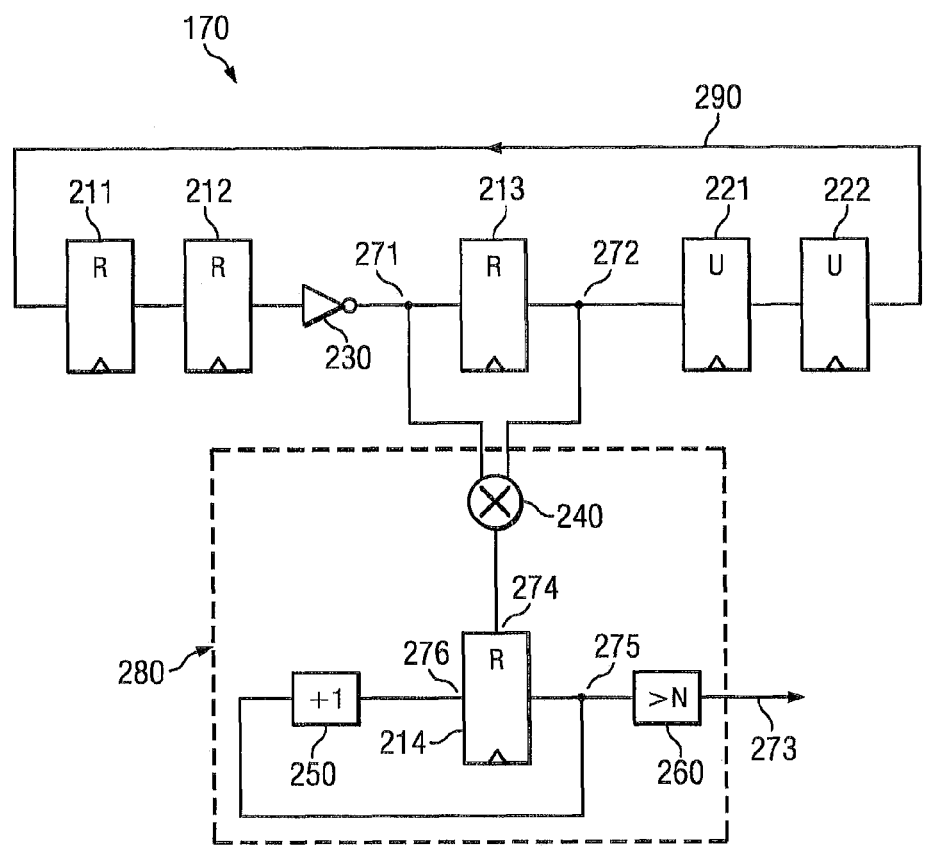
FIG. 2 shows a clock checking block of FIG. 1 in more detail.

FIG. 2 shows a plurality of flip-flops connected in a loop 209. The loop 290 comprises a first flip-flop 211, a second flip-flop 212, a third flip-flop 213, a fourth flip-flop 221 and a fifth flip-flop 222. Each of the first to fifth flip-flops have one input and one output shown in FIG. 2. Each of the first to fifth flip-flops has a clock input that receives an input clock signal (not shown in FIG. 2).

The input of the first flip-flop 211 is connected to the output of the fifth flip-flop 222. The output of the first flip-flop 211 is connected to the input of the second flip-flop 212 and the output of the second flip-flop 212 is connected to a first input of a NOT gate 230. The NOT gate 230 comprises the first input and a first output and is operable to invert a signal on the first input of the NOT gate 230 and output this value on the first output. The first output of NOT gate 230 is connected to the input of the third flip-flop 213. The output of third flip-flop 213 is connected to the input of the fourth flip-flop 221. The output of the fourth flip-flop 221 is connected to the input of the fifth flip-flop 222. In this way, the first to fifth flip-flops 211, 212, 213, 221, 222 and NOT gate 230 form a continuous closed loop.

A first input of a XOR gate 240 is connected to the input of the third flip-flop 213 at a node 271 and a second input of the XOR gate 240 is connected to the output of the third flip-flop 213 at a node 272. The XOR gate comprises the first and the second inputs and an output and is operable to output a logic high on the output when the first input and the second input differ. The output of the XOR gate 240 forms a first input 274 of a sixth flip-flop 214.

The sixth flip-flop 214 has a first output which is connected to an input of a compare block 260 on a first line and an input of an increment block 250 on a second line. The first output is connected to a node from which the first line connects to the input of the compare block 260 and the second line connects to the input of the increment block 250. An output of the increment block 250 is connected to a second input of the sixth flip-flop 214. The compare block 260 comprises an output line 273. Output line 273 may be an alarm signal output line.

The XOR gate 240, increment block 250, sixth flip-flop 214 and compare block 260 form a count and compare block 280 from which output signal 273 is output.

As mentioned previously, clock checking block 170 receives a reliable clock signal from external clock source 160 and an unreliable clock signal from timing generation block 110. The reliable clock signal (not shown) is used to clock the first, second, third and sixth flip-flops 211, 212, 213 and 214. The unreliable clock signal (not shown) is used to clock the fourth and fifth flip-flops 221 and 222. That is, the reliable and unreliable clock signals are input into the clock input of the respective flip-flops and drive the flip-flop.

Although FIG. 2 shows six flip-flops, more or less may be used. Furthermore the XOR gate 240 may be connected across any other of the flip-flops in the loop which are clocked by the reliable clock with the exception of the resynchronising flip-flops which are used to retime the looped back signal from the unreliable clock domain into the reliable clock domain. In some embodiments two such flip-flops (eg flip-flops 211 and 212) are sufficient for this resynchronising. Where the reliable clock is provided by an external crystal clock, two resynchronising flip flops may be provided. In alternative embodiments, more than two flip-flops may be provided for resynchronising. The XOR gate is connected across a flip-flop which is clocked by the same clock as the clock flip-flop 214, that is one clocked by a reliable clock.

Count and compare block 280 may also be implemented with any relevant circuitry and is not restricted to the specific example shown in FIG. 2. It will be appreciated that the NOT gate 230 and XOR gate 240 may be implemented by any equivalent circuitry. For example the NOT gate 230 may be implemented by circuitry capable of inverting a signal.

The functioning of the circuit shown in FIG. 2 will now be described with reference to FIG. 4.

Figure 4:
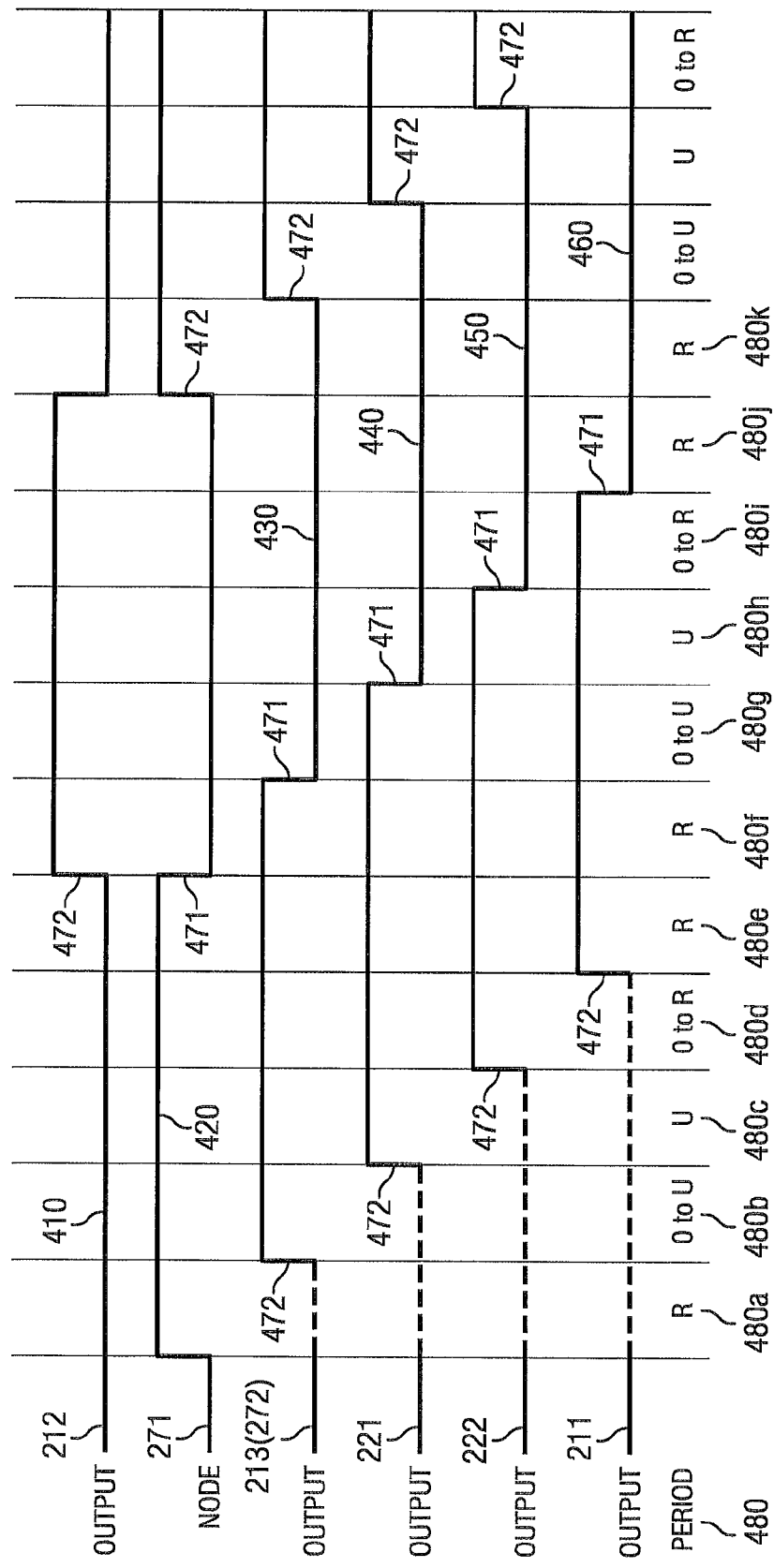
FIG. 4 shows a timing diagram for the clock checking block of FIG. 2.

FIG. 4 shows the output of each flip-flop and NOT gate 230 in the loop 209 along with the period 480 for which that output is valid. An assumption is made that the output of each flip-flop is always a logic high or a logic low. This assumption will be discussed later.

FIG. 4 shows the output of the second flip-flop 212 on line 410, the output of the third flip-flop 213 on line 430, output of the fourth flip-flop 221 on line 440, the output of the fifth flip-flop 222 on line 450 and the output of the first flip-flop 211 on line 460. All of the abovementioned outputs and a value of the signal at the first node 271 of FIG. 2 are plotted against the period 480 for which that output is valid.

In the first period 480a in FIG. 4 the output of the second flip-flop 212 is shown as a logic low. The output of the second flip-flop 212 forms the input of NOT gate 230 and as a result the value of the signal at the first node 271 (the output of the NOT gate 230) goes high as soon as the output of second flip-flop 212 goes low. The output of the NOT gate 230 forms the input into the third flip-flop 213 and is a high.

Although the input of the third flip-flop 213 is high, the output of third flip-flop 213 will only take on the value of the input when the third flip-flop 213 is clocked. Period 480a shows the output 410 of the second flip-flop 212 as a low, the output 420 and of the first node 271 as a high. The remaining output lines 430, 440, 450 and 460 are undefined. The output of the third flip-flop is undefined as this flip-flop has not been clocked yet.

Both the second flip-flop 212 and the third flip-flop 213 are clocked by the reliable clock and are therefore synchronised. The input of the third flip-flop 213 is clocked to the output of the third flip-flop 213 one period (R) of the reliable clock later. Period 480b shows the output 430 of the third flip-flop 213 go high as the input of the third flip-flop 213 is clocked to its output 430. The second flip-flop 212 is clocked simultaneously to the third flip-flop 213 and the output 410 of the second flip-flop is held low in period 480b.

The output 430 of the third flip-flop 213 is clocked high in period 480b and forms the input into of the fourth flip-flop 221. The third flip-flop 213 is clocked by the reliable clock with a clock period R while the fourth flip-flop 221 is clocked by the unreliable clock with a clock period of U. Because the third flip-flop 213 and the fourth flip-flop 221 are in two different clock domains (i.e. they are clocked by different clocks) the fourth flip-flop 221 is not clocked synchronously with the third flip-flop 213 and the input of the fourth flip-flop 221 is clocked out at any time from immediately after the third flip-flop 213 is clocked to a period of the unreliable clock (U) later. Period 480b shows the output of the third flip-flop 213 being held high for a period in the range of 0 to U, until the fourth flip-flop 221 is clocked by the unreliable clock.

The fourth flip-flop 221 is clocked by the unreliable at the start of period 480c and the output 440 of fourth flip-flop 221 goes high and forms the input of the fifth flip-flop 222. In period 480c the second flip-flop 212 holds a low output, the third flip-flop 213 holds a high output and the not gate 230 holds a high output while the output of fourth flip-flop 221 is clocked high.

Both the fourth flip-flop 221 and the fifth flip-flop 222 are clocked by the unreliable clock, so the output 440 of the fourth flip-flop 221 is held high for a period of U before it is clocked in by the fifth flip-flop 222 and the output 450 of the fifth flip-flop 222 goes high. Period 480c shows the output of the fourth flip-flop 221 being held high for a period of U before the fifth flip-flop 222 is clocked and its output 450 goes high in the next period 480*d*. During period 480*c* the output 410 of second flip-flop 212 is held low while the value of the signal at the first node 271, the output 430 of the third flip-flop and the output 440 of the fourth flip-flop 221 are all held high. The input of the fifth flip-flop 222 has not been clocked through the flip-flop yet and its output remains undefined.

In period 480*d* the high on the output 440 of the fourth flip-flop is clocked through the fifth flip-flop 222 and the output 450 of the fifth flip-flop 222 becomes high. In period 480*d*, the output 410 of the second flip-flop 212 remains low while the value of the signal 420 at the first node 271, the output 430 of the third flip-flop 213 and the output 440 of the fourth flip-flop 221 remain high.

The output 450 of the fifth flip-flop 222 forms the input of the first flip-flop 211. The fifth flip-flop 222 is clocked by the unreliable clock and the first flip-flop 211 is clocked by the reliable clock. The flip-flop 211 may be clocked at any time from 0 to R after the fifth flip-flop 222 is clocked because the fifth and first flip-flops are in different clock domains. Period 480*d* shows the output 450 of the fifth flip-flop 222 being held for a period of 0 to R before the first flip-flop 211 clocks the high on the output 450 of the fifth flip-flop 222 to the output 460 of the first flip-flop 211.

In period 480*e* the high on the output 450 of the fifth flip-flop 222 is clocked through the first flip-flop 211 and the output 460 of the first flip-flop 211 becomes high. In period 480*e*, the output 410 of the second flip-flop 212 remains low while the value of the signal 420 at the first node 271, the output 430 of the third flip-flop 213, the output 440 of the fourth flip-flop 221 and the output 450 of the fifth flip-flop 222 remain high.

The output 460 of the first flip-flop 211 forms the input to the second flip-flop 212. Both are clocked by the reliable clock, so the output 460 of the first flip-flop 211 is clocked to the output 420 of the second flip-flop 212 a period R after the output 460 of the first flip-flop 211 has gone high. Period 480*e* shows the output 460 of the first flip-flop 211 being held high for a period of R before the output 410 of the second flip-flop 212 is clocked high.

In period 480*f* the high on the output 460 of the first flip-flop 211 is clocked through the second flip-flop 212 and the output 410 of the second flip-flop 212 becomes high. The output 210 of the first flip-flop 212 is connected to the input of the NOT gate 230 and the value of the signal 220 at the first node 272 goes low as soon as the first flip-flop 212 is clocked.

In period 480*f*, the output 430 of the third flip-flop 213, the output 440 of the fourth flip-flop 221, the output 450 of the fifth flip-flop 222 and the output 460 of the first flip-flop 211 remain high. The second flip-flop 212 and the third flip-flop 213 are both clocked by the reliable clock and so there is a period of R before the third flip-flop 213 clocks the low at its input from the NOT gate 230 to the output 430 of the third flip-flop 213.

The output of each flip-flop 212, 213, 221, 222, 211 of the loop 290 form the respective input for the next flip-flop in the loop 290. A difference between the input of a flip-flop and the output of the same flip-flop will be clocked through the successive flip-flops in the loop according to their respective clock signals. In other words, because the NOT gate 230 inverts the signal on its input the inverted signal creates a difference between the input of the third flip-flop 213 and the output 230 of flip-flop 213. When the third flip-flop 213 is next clocked, the output 430 of the third flip-flop takes on the same value as the input of the third flip-flop 213, however the input of the next flip-flop (fourth flip-flop 221) is now different to the output 440 of the fourth flip-flop until the fourth flip-flop is next clocked. In this way a difference between the input and output of a respective flip-flop (an edge) is propagated around the loop of flip-flops 290.

Referring now to period 480*f* in FIG. 4, the low output from the NOT gate 230 is clocked through the successive flip-flops 213, 221, 222, 211 and 212 in periods 480*g*, *h*, I, j and k respectively. In period 480*k*, the NOT gate 230 converts the low signal received on the output 410 from second flip-flop 212 to a high signal. This high signal is then clocked through the flip-flops of loop 290 until in successive periods until it is converted to a low by NOT gate 230.

In this manner a difference between the input and output of each flip-flop is propagated through the loop 290. This difference forms an edge. In periods 480*a* to 480*f*, an edge of low to high 472 is shown propagating from the first node 271 in period 480*a* to the second flip-flop 212 in period 480*f* through successive flip-flops in the successive periods. In periods 480*g* to 480*k* an edge of high to low 471 is shown propagating from the first node 271 in period 480*g* to the second flip-flop 212 in period 480*k* through successive flip-flops in the successive periods.

The time taken for an edge to propagate around the loop of flip-flops 290 is the sum of the time taken for each flip-flop to clock an edge from its input to its output. In the architecture of FIG. 2 the time taken for an edge to propagate around the loop of flip-flops 290 is the sum of periods 480*a*, 480*b*, 480*c*, 480*d* and 480*e*.

The time taken for an edge to propagate through the loop of flip-flops 290 of FIG. 2 should therefore be in the range of:

$$2R+U \text{ to } 3R+2U \tag{1}$$

The period R of the reliable clock remains constant as the reliable clock can be trusted to keep the same frequency. The period of the unreliable clock may not remain constant as the unreliable clock may be tampered with and its frequency may change. Period U of the unreliable clock is the expected period of the clock. In other words, period U is the period of the unreliable clock if it is running normally and has not been tampered with.

An edge is continuously propagated through the loop of flip-flops 290 depicted in FIG. 2 and the amount of time an edge should take (if the unreliable clock was running at the expected frequency) is known from the loop 290 and given by equation (1).

Using the loop 290, count and compare block 280 counts the time taken for an edge to propagate through the loop of flip-flops 290 and raises an alarm on line 273 if the time taken for an edge to propagate through the flip-flops is not within the expected time range.

The functioning of the count and compare block 280 is discussed with reference to FIGS. 2 and 6.

FIG. 2 shows the first input of the XOR gate 240 connected to the input of the third flip-flop 213 at first node 271 and the second input of the XOR gate 240 is connected to the output 430 of the third flip-flop 213 at the second node 272. The XOR gate 240 detects an edge. In other words the XOR gate 230 detects when the input of the third flip-flop 213 is different to the output of the third flip-flop 213. An edge is detected across the third flip-flop 213 once it has propagated all the way round the loop of flip-flops 290.

Referring to FIG. 4, the signal at node 271 is held for a period of R before flip-flop 213 is clocked and it is output on line 430. For most of the propagation of the edge the signal at 271 is the same as the output 430 of the third flip-flop 213 in the same period. For example in periods 480*b*, 480*c*, 480*d* and 480*d* the signal at 271 and the output of flip-flop 213 are both high.

For periods 480*b*, 480*c*, 480*d* and 480*e* the XOR gate 240 receives as its first and second inputs two identical signals and consequently outputs a low to the sixth flip-flop 214. Similarly, when a high to low edge is propagating through the loop of flip-flops, XOR gate 240 receives two lows and outputs a low to the sixth flip-flop 214.

When the edge is clocked through flip-flop 213 in periods 480*a*, 480*f* and 480*k* in FIG. 4, the value of the signal at the first node 271 is different to the output 430 of the third flip-flop 213 for an entire period R. In period 480*f* the output of the third flip-flop 213 at the second node 272 is a high while the input at the first node 271 is a low. In this case, the XOR gate 240 outputs a high to the first input of the sixth flip-flop.

When XOR gate 240 detects an edge the XOR gate 240 causes the first input 274 of the sixth flip-flop to go high.

The sixth flip-flop 214 is implemented as a counter. The first output of the sixth flip-flop 214 outputs the current value of a counter to a node 275. At node 275 the current value of the counter output by the sixth flip-flop 214 is input into a compare block 260 on the first line. The second line from node 275 is input into the increment block 250. Increment block 250 receives the current value of the counter and increments it. The incremented count value is input to a second input 276 of the sixth flip-flop 214. The sixth flip-flop 214 is clocked by the reliable clock and outputs the incremented counter value to the first output for each period of the reliable clock. In this manner the counter value is incremented for each period of the reliable clock.

The first input 274 receives an input from the XOR gate 240 indicating that an edge has been detected. When an edge is detected the counter value is reset to zero. The sixth flip-flop 214 and increment block 250 count the number of reliable clock cycles taken for an edge to propagate around the loop of flip-flops 290.

The compare block 260 compares the value of the counter received at the node 275 to a threshold to determine whether the time taken for the edge to propagate through the flip-flops is as expected. If the threshold is breached an alarm signal is output on line 273. The threshold may be set to a minimum threshold or a maximum threshold or the threshold may be within a range.

The threshold value is determined by the expected time taken for an edge to propagate through the loop 290, for example equation (1). As discussed in relation to FIG. 3 the time taken for an edge to propagate through the loop of flip-flops should be within the range of: $2R+U$ to $3R+2U$.

If the threshold is implemented as a maximum, then if the counter reaches up to N, the alarm is triggered. N can be hard-wired, or securely programmed. The point is that while the clock period U of the unreliable clock is such that $NR<2R+U$, the alarm will definitely fire. If $NR>3R+2U$, the alarm will definitely never fire. If $(2R+U)<NR<(3R+2U)$, the alarm may or may not fire, it all depends on how the two clocks happen to line up.

To implement a minimum threshold, logic is provided whereby the alarm triggered if the XOR gate indicates an edge is passing, and the counter has not yet reached N (and when the counter does reach N, the counter stays there until an edge arrives, at which point the counter resets to zero and starts counting up again). Similarly, in such a case, if the clock period U of the unreliable clock is such that $NR<2R+U$, the alarm will definitely not fire. If $NR>3R+2U$, the alarm will definitely fire.

If $(2R+U)<NR<(3R+2U)$, the alarm may or may not fire, it all depends on how the two clocks happen to line up.

Accordingly, the values of N may be selected such that the required threshold is set up to ensure that the desired minimum threshold occurs is the $NR>3R+2U$ region and/or the desired maximum threshold is in the $NR<2R+U$ regions.

The counter and compare block 280 count multiples of the R.

The compare block 260 may be programmable or the threshold may be hard-wired.

Figure 5:
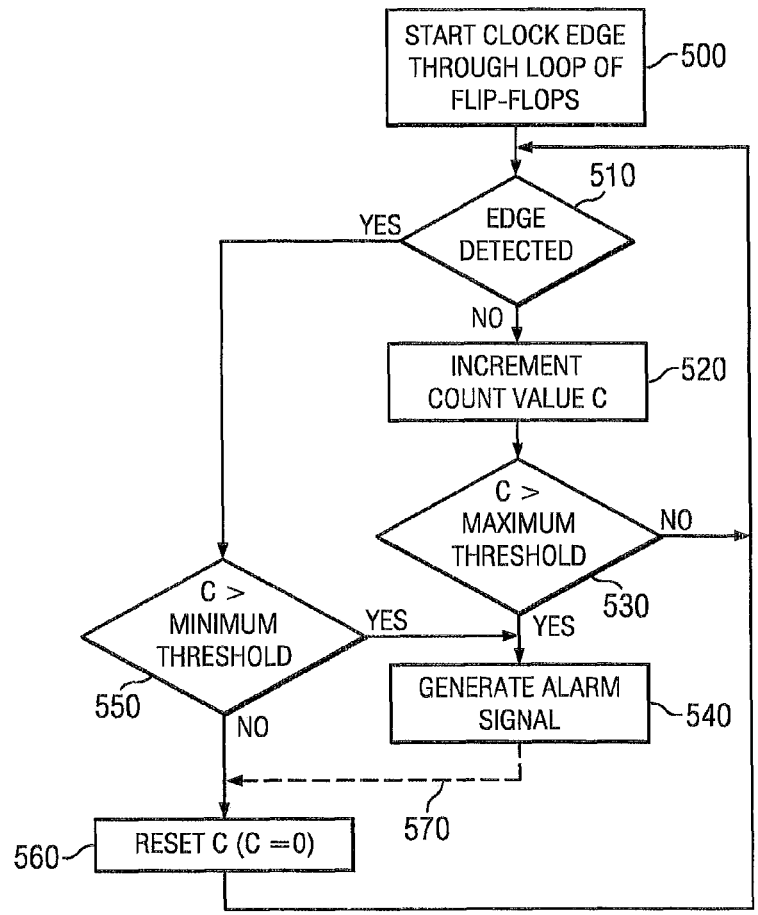
FIG. 5 is a flow diagram of the method steps carried out by some embodiments of the inventions.

FIG. 5 is a flow diagram of the functioning of the circuit shown in FIG. 2 with particular emphasis on the count and compare block 280.

As mentioned with reference to FIG. 2, an edge is propagated through the loop of flip-flops 290. At step 500 of FIG. 5, a first clock edge is propagated through the loop 290. This begins the continuous propagation of a clock edge as described with reference to FIG. 2. In the next step 510, it is determined whether or not an edge is detected. If an edge is not detected, the flow diagram proceeds to step 520 where the counter increments the count value.

The counter value is then compared to a maximum threshold value in step 530. If the value of the counter is greater than the maximum threshold an alarm signal is generated at step 540 to indicate that the unreliable clock is slower or running at a lower frequency than the expected frequency of the unreliable clock. If the count value is not higher than the maximum threshold the flow diagram returns to step 510 where it is determined if an edge is detected.

If an edge is detected at step 510, the flow diagram proceeds to step 550 where it is determined whether the value of counter is lower than a minimum threshold value. If the value of the counter is less than the minimum threshold an alarm signal is generated at step 540 to indicate that the unreliable clock is faster or running at a higher frequency than the expected frequency of the unreliable clock.

If the counter value is not lower than the minimum threshold value, the flow diagram proceeds to step 510 where it is determined whether an edge has been detected.

The alarm at step 540 can be raised if the time taken to propagate through the loop of flip-flops 290 is slower than expected. This indicates that the unreliable clock has a lower frequency than expected and is identified by the maximum threshold comparison block 530. Alternatively an alarm can be raised if the edge propagates through the flip-flops faster than expected. This indicates that the unreliable clock has a higher frequency than expected and is identified by the minimum threshold block 550. Alternatively an alarm can be raised for both the unreliable clock having a higher frequency than expected and a lower frequency than expected.

An alarm being raised for both the unreliable clock having a higher frequency than expected and a lower frequency than expected is shown in FIG. 5 which contains both a minimum and maximum comparison threshold block however it will be understood that both the maximum threshold comparison block 530 and the minimum threshold comparison block 550 need not be present.

If an alarm is to be raised only when the unreliable clock is slower than expected, the minimum threshold block 550 may be omitted. In this case if an edge is detected the counter is reset and the flow diagram returns to the edge detection step 500.

If an alarm is to be raised only when the unreliable clock is faster than expected, the maximum threshold block 530 may be omitted. In this case if an edge is not detected the counter is incremented at step 520 and the flow diagram returns to the edge detection step 500.

The conditions under which an alarm is raised is implementation specific and is set by the compare block 260.

Once the alarm has been raised at block 540, the flow-diagram may return to block 560 and reset the counter. In this case the clock checking block 170 continues to monitor the received clock frequency. The loop from the generate alarm signal block 540 to reset block 560 is shown by a dotted line 570 as this return may be implementation or situation specific. Alternatively after an alarm is raised the clock checking block 170 may cease to function as some action is taken in response to the alarm.

Figure 3:
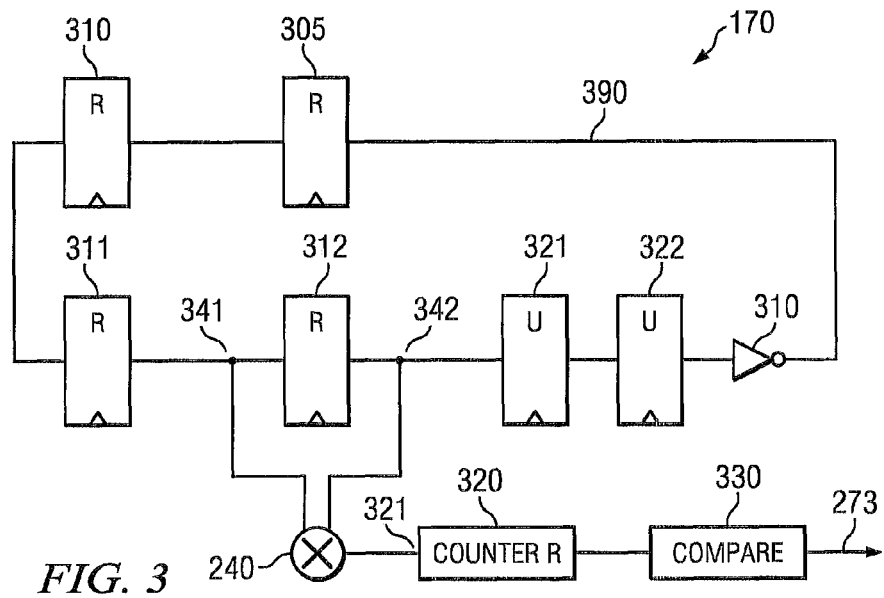
FIG. 3 shows an alternative clock checking block of FIG. 1.

FIG. 3 shows an alternative architecture for an embodiment of the present invention. Like reference numerals have been used to depict like components.

FIG. 3 shows a plurality of flip-flops connected in a loop 390. The loop 390 comprises a first flip-flop 311, a second flip-flop 312, a third flip-flop 321, a fourth flip-flop 322, a fifth flip-flop 309 and a sixth flip-flop 310. Each of the first to sixth flip-flops have one input and one output shown in FIG. 3. Each of the first to sixth flip-flops has a clock input that receives an input clock signal (not shown in FIG. 3).

The output of the first flip-flop 311 is connected to the input of the second flip-flop 312. The output of the second flip-flop 312 is connected to the input of the third flip-flop 321. The output of the third flip-flop 321 is connected to the input of the fourth flip-flop 322. The output of the fourth flip-flop 322 is connected to a first input of a NOT gate 310. The NOT gate 310 comprises the first input and a first output and is operable to invert a signal on the first input of the NOT gate 310 and output this value on the first output. The first output of the NOT gate 310 is connected to the input of the fifth flip-flop 309, the output of which is connected to the input of the sixth flip-flop 310. The output of the sixth flip-flop is connected to the input of the first flip-flop 311. In this way, the first to sixth flip-flops 311, 312, 321, 322 and NOT gate 310 form a continuous closed loop.

A first input of the XOR gate 240 is connected to the output of the second flip-flop 312 at a first node 341 and a second input of the XOR gate 240 is connected to the output of the second flip-flop at a second node 342. An output of the XOR gate 240 is connected to an input 321 of counter block 320. An output of the counter block 320 is connected to an input of a compare block 330 which outputs a signal 273. The signal 273 may be an alarm signal.

As mentioned previously, clock checking block 170 receives a reliable clock signal from external clock source 160 and an unreliable clock signal from timing generation block 110. The reliable clock signal (not shown) is used to clock the first and second flip-flops 311, 312, the fifth and sixth flip-flops 309 and 310 (resynchronising flip-flops), and the counter block 320. The unreliable clock signal (not shown) is used to clock the third and fourth flip-flops 321, 322. That is, the reliable and unreliable clock signals are input into the clock input of the respective flip-flops and drive the flip-flop.

The counter block 320 may be any appropriate circuitry capable of incrementing a count value each clock period. The compare block 330 may be any appropriate circuitry capable of making a comparison and generating an output based on that comparison.

FIG. 3 gives and additional example of an architecture for an embodiment of the present invention. As mentioned previously, the architecture of various implementations of the present invention may differ however the basic functioning remains the same. The arrangement of FIG. 3 functions is a similar manner to the circuitry of FIG. 2.

The XOR gate 240 detects the edges as they propagate through the second flip-flop 312. The counter block 320 of FIG. 3 receives the output signal from the XOR gate 240. The output from XOR gate 240 is generated in a similar manner to that of the XOR gate 240 of FIG. 2. The counter block 320 counts reliable clock periods R until a reset signal is received on the output of the XOR gate 240. This reset signal is as in relation to FIG. 2. The compare block 330 compares the value of the counter to a threshold value which corresponds the expected time taken for an edge to propagate around the loop of flip-flops 390 and outputs and alarm signal based on this. As mentioned with reference to FIG. 2, the alarm signal may be based on any deviation from the threshold.

Although FIG. 3 shows a different architecture to FIG. 2, both architectures are capable of determining a relationship between the reliable clock signal and the unreliable clock signal and generating an alarm based on that relationship.

The relationship is determined by the number of reliable clock periods taken for an edge to propagate around a loop of flip flops. An expected relationship between the reliable clock frequency and unreliable clock frequency is the time taken for an edge to propagate around the loop of flip-flops with the unreliable clock running at its expected frequency with the period of the unreliable clock equal to U.

Because the unreliable clock period and therefore frequency may be different to the expected frequency and period of the unreliable clock (due to for example tampering) the number of reliable clock periods counted by the counter determines an actual relationship between the unreliable clock and reliable clock.

The actual relationship may be the same as or in the same range as the expected relationship. In this case no alarm will be raised because the relationship between the unreliable clock and reliable clock is as expected and therefore the unreliable clock frequency is as expected because the reliable clock frequency is fixed. Where the actual relationship differs from the expected relationship an alarm is raised because this indicates that the frequency of the unreliable clock has changed and is different to its expected frequency.

The reliable clock frequency acts as a reference frequency to which the unreliable clock frequency can be measured against. Any change in the relationship between the reliable clock frequency and unreliable clock frequency will indicate a change in the unreliable clock frequency.

The reliable clock may in some embodiments be constant. Alternatively the reliable clock may have a frequency that is guaranteed to stay in a known fixed range. For example it might vary by a factor of x due to temperature and voltage, but its range of variation is reliably known. The reliable clock might come from an external crystal, but it could also come from an on-chip oscillator (e.g. a ring oscillator, or a relaxation oscillator), or from a clock divider or multiplier (e.g. PLL) that is in turn driven by a trusted oscillator. Any of these types of clock source could be potentially considered unreliable, depending on the circumstances.

Embodiments of the invention may be used in a set top box.

While this detailed description has set forth some embodiments of the present invention, the appended claims cover other embodiments of the present invention which differ from the described embodiments according to various modifications and improvements. For example, the number of flip-flops in the propagation loop may be altered; the flip-flop across which an edge may be detected is not restricted to those described above and may be any flip-flop in the loop clocked by the reliable clock and not relied upon for re-synchronisation; the clock check block 170 may detect one or both of if a clock signal has been sped up and slowed down; the flip-flops may be exemplary only and any suitable storage element may be used.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method, comprising:
   receiving a first potentially unreliable clock signal having a first frequency;
   receiving a second reliable clock signal having a second frequency, wherein the first frequency and the second frequency should have an expected relationship; and
   determining whether the first potentially unreliable clock signal has changed with respect to the second reliable clock signal by determining an actual relationship between the first potentially unreliable clock signal and the second reliable clock signal and generating an alarm signal if the actual relationship is different from the expected relationship,
   wherein determining the actual relationship between the first potentially unreliable clock signal and the second reliable clock signal comprises clocking an edge through a continuous loop of a plurality of storage elements,
   wherein at least two of the plurality of storage elements in the continuous loop are clocked by the first potentially unreliable clock signal and at least two other storage elements of the plurality of storage elements in the continuous loop are clocked by the second reliable clock signal.

2. The method of claim 1, wherein the expected relationship is between the first frequency and an expected frequency of the second clock signal.

3. The method of claim 1, wherein the second frequency is a known frequency.

4. The method of claim 1, further comprising receiving the second reliable clock signal from one of:
   a crystal oscillator external to an integrated circuit;
   an on-chip oscillator;
   clock circuitry driven by a trusted oscillator; and
   a software programmable clock generator on an integrated circuit.

5. The method of claim 1, further comprising receiving the first potentially unreliable clock signal from one of:
   a crystal oscillator external to an integrated circuit;
   an on-chip oscillator;
   clock circuitry driven by a trusted oscillator; and
   a software programmable clock generator on an integrated circuit.

6. The method of claim 1, further comprising:
   generating the alarm if the actual relationship between the first clock signal and the second clock signal indicates that the first frequency is at least one of lower and higher than the second frequency.

7. The method of claim 1, wherein determining the actual relationship between the first potentially unreliable clock signal and the second reliable clock signal further comprises:
   adjusting a counter responsive to a period of the second reliable clock signal; and
   comparing a value of the counter to a predetermined value.

8. The method of claim 7, further comprising resetting the counter when a determination is made that the edge has propagated through all of the plurality of storage elements.

9. The method of claim 8, the method further comprising resetting the counter when the edge has propagated around the loop.

10. The method of claim 8, wherein: determining whether the edge has propagated through all of the plurality of storage elements comprises comparing an input of one of the plurality of storage elements with an output of the one of the plurality of storage elements.

11. The method of claim 7, wherein the predetermined value is selected taking into account a number of periods of the second reliable clock signal that the edge would be expected to take to propagate through all of the plurality of storage elements if the actual relationship between the first potentially unreliable clock signal and second reliable clock signal was equal to the expected relationship.

12. The method of claim 7, further comprising:
   generating the alarm to indicate that the first clock is slower than expected in response to determining that the counter has reached the predetermined value before the edge has propagated through all of the plurality of storage elements.

13. The method of claim 7, further comprising:
   generating the alarm to indicate that the first clock is faster than expected in response to determining that the counter value has not reached the predetermined value before the edge has propagated through all of the plurality of storage elements.

14. The method of claim 7, wherein the edge is created by an inverting logic element.

15. The method of claim 1, further comprising:
   clocking a functional block on an integrated circuit with the first potentially unreliable clock signal.

16. The method of claim 1, wherein each of the storage elements is a flip-flop.

17. A functional block for an integrated circuit, comprising:
   clock checking circuitry configured to receive a first potentially unreliable clock signal having a first frequency and to receive a second reliable clock signal having a second frequency, wherein the first frequency and the second frequency should have an expected relationship,
   wherein the clock checking circuitry is further configured to determine whether the first potentially unreliable clock signal has changed with respect to the second reliable clock signal by:
      determining an actual relationship between the first potentially unreliable clock signal and the second reliable clock signal, and
      generating an alarm signal if the actual relationship is different from the expected relationship,
   wherein determining the actual relationship between the first potentially unreliable clock signal and the second reliable clock signal comprises:

clocking an edge through a continuous loop of a plurality of storage elements, wherein at least two of the plurality of storage elements in the continuous loop are clocked by the first potentially unreliable clock signal and at least two other storage elements of the plurality of storage elements in the continuous loop are clocked by the second reliable clock signal.

18. A security block for an integrated circuit, comprising:
a clock checking block configured to receive a first potentially unreliable clock signal having a first frequency and to receive a second reliable clock signal having a second frequency, wherein the first frequency and the second frequency should have an expected relationship,
wherein the clock checking block is further configured to determine whether the first potentially unreliable clock signal has changed with respect to the second reliable clock signal by:
determining an actual relationship between the first potentially unreliable clock signal and the second reliable clock signal, and
generating an alarm signal if the actual relationship is different from the expected relationship,
wherein determining the actual relationship between the first potentially unreliable potentially unreliable clock signal and the second reliable reliable clock signal comprises:
clocking an edge through a continuous loop of a plurality of storage elements, wherein at least two of the plurality of storage elements in the continuous loop are clocked by the first potentially unreliable clock signal and at least two other storage elements of the plurality of storage elements in the continuous loop are clocked by the second reliable clock signal.

19. The security block according to claim 18, wherein the integrated circuit is determined not to have been tampered with when the monitored signals are within an expected behavior of the integrated circuit.

20. The security block of claim 19, wherein the expected behavior is when the integrated circuit is functioning normally.

* * * * *